(12) United States Patent
Ouerghi

(10) Patent No.: US 9,053,933 B2
(45) Date of Patent: Jun. 9, 2015

(54) METHOD FOR FORMING A GRAPHENE LAYER ON THE SURFACE OF A SUBSTRATE INCLUDING A SILICON LAYER

(71) Applicant: CENTRE NATIONAL DE LA RECHERCHE SCIENTIFIQUE, Paris (FR)

(72) Inventor: Abdelkarim Ouerghi, Palaiseau (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 14/348,653

(22) PCT Filed: Sep. 28, 2012

(86) PCT No.: PCT/EP2012/069232
§ 371 (c)(1),
(2) Date: Mar. 31, 2014

(87) PCT Pub. No.: WO2013/045641
PCT Pub. Date: Apr. 4, 2013

(65) Prior Publication Data
US 2014/0242784 A1 Aug. 28, 2014

(30) Foreign Application Priority Data
Sep. 30, 2011 (FR) ...................... 11 58818

(51) Int. Cl.
*H01L 21/02* (2006.01)
*H01L 29/16* (2006.01)
*C01B 31/04* (2006.01)
*B82Y 30/00* (2011.01)
*B82Y 40/00* (2011.01)

(52) U.S. Cl.
CPC .... *H01L 21/02527* (2013.01); *H01L 21/02104* (2013.01); *H01L 21/02376* (2013.01); *H01L 29/1606* (2013.01); *C01B 31/0461* (2013.01); *C01B 31/0446* (2013.01); *H01L 21/02381* (2013.01); *H01L 21/02447* (2013.01); *H01L 21/02612* (2013.01); *B82Y 30/00* (2013.01); *B82Y 40/00* (2013.01)

(58) Field of Classification Search
None
See application file for complete search history.

(56) References Cited

U.S. PATENT DOCUMENTS

| 7,947,581 | B2 * | 5/2011 | Ma ................................ 438/509 |
| 8,187,955 | B2 * | 5/2012 | Chu et al. ....................... 438/479 |
| 2009/0020764 | A1 * | 1/2009 | Anderson et al. ................ 257/77 |
| 2010/0065988 | A1 * | 3/2010 | Hannon et al. ................. 264/500 |

(Continued)

OTHER PUBLICATIONS

Oliveira et al., Influence of the silicon carbide surface morphology on the epitaxial graphene formation, Applied Physics Letters, Sep. 12, 2011, p. 111901, vol. 99, No. 11.*

(Continued)

*Primary Examiner* — Andres Munoz
(74) *Attorney, Agent, or Firm* — Sughrue Mion, PLLC

(57) ABSTRACT

The invention relates to a method for forming a graphene layer (105) on the surface of a substrate (100) including a silicon layer (101), the method comprising the consecutive steps of: forming (1) a silicon-carbide film (103) on a free surface of the silicon layer and gradually heating the substrate until the silicon of at least the first row of atoms of the silicon-carbide film is sublimated so as to form the graphene layer on the silicon-carbide film. According to the invention, a silicon layer, the free surface of which is stepped, is used.

7 Claims, 3 Drawing Sheets

(56) References Cited

U.S. PATENT DOCUMENTS

2010/0200840 A1* 8/2010 Anderson et al. ............... 257/29
2011/0073834 A1* 3/2011 Hannon et al. .................... 257/9

OTHER PUBLICATIONS

Dimitrakopoulos et al., Wafer-scale epitaxial graphene growth on the Si-face of hexagonal SiC (001) for high frequency transistors, Journal of Vacuum Science and Technology: Part B, Sep. 7, 2010, pp. 985-992, vol. 28, No. 5.*

Emtsev et al., Towards wafer-size graphene layers by atmospheric pressure graphitization of silicon carbide, Nature Materials, vol. 8, p. 203-207, Feb. 8, 2009.*

A. Ouerghi et al., "Structural coherency of epitaxial graphene on 3Ca SiC (111) epilayers on Si (111)", Applied Physics Letters, American Institute of Physics, Oct. 18, 2010, p. 161905-1-161905-3, vol. 97, No. 16, Melville, NY, US.

International Search Report for PCT/EP2012/069232 dated Nov. 27, 2012.

* cited by examiner

METHOD FOR FORMING A GRAPHENE LAYER ON THE SURFACE OF A SUBSTRATE INCLUDING A SILICON LAYER

The invention relates to a process for forming a graphene layer on the surface of a substrate comprising a silicon layer.

In the present application, conventional staircase terminology will be used in which a tread is the surface on which a foot is put, a riser is the surface extending between two treads, tread run is the depth of a tread from riser to riser, step rise is the height of a riser tread to tread.

BACKGROUND OF THE INVENTION

Graphite is an allotrope of carbon having a crystal structure that consists of a stack of planes of hexagonal rings formed by carbon atoms, a plane of rings being called graphene.

In the present application, the expression "graphene layer" will be understood to mean both a single plane of rings and a stack of a number of planes of rings in which each plane of rings is turned relative to the other planes of rings in the stack. Specifically, in the latter case, each plane of rings (graphene) has properties that are independent from those of the other planes of rings, thereby differentiating it from a graphite block in which each plane of rings has substantially the same properties as the other planes of rings.

Graphene possesses exceptional electronic properties and could revolutionize the field of electronics. However, graphene is a material that is difficult to isolate. Thus, in the last few years, many research projects have been conducted in an attempt to understand the electronic properties of graphene and to manufacture such a material.

Currently, two main processes are used to manufacture a graphene layer.

A first process, called the exfoliation process, consists in sampling a thin strip from a bulk graphite substrate using adhesive tape. This operation is carried out again on the strip thus sampled in order to obtain a new thinner strip. This process is repeated until samples of a single layer of atoms, i.e. a layer of graphene, are obtained.

However, this process proves to be difficult to implement from an industrial point of view.

A second process consists in forming a graphene layer on the surface of a silicon carbide substrate. The substrate is gradually heated until sublimation of the silicon in at least the first lattice-arrays of atoms in the substrate in order to form the graphene layer on the free surface of said substrate.

However, this process proves to be very expensive to implement since silicon carbide substrates come with a very high price tag.

Recently, a third process that is an improvement over the two aforementioned processes has been developed. This third process consists in forming a graphene layer on the surface of a substrate comprising a silicon layer, and comprises, in succession, steps of:
  forming a silicon carbide film on a free surface of the silicon layer; and
  gradually heating the substrate until sublimation of the silicon in at least the first lattice-arrays of atoms of the silicon carbide film, in order to form the graphene layer on the silicon carbide film.

Forming a silicon carbide film allows a "tie" layer to be formed, enabling formation of the graphene. Using this type of substrate greatly decreases the cost of producing such a graphene layer since silicon substrates or substrates comprising a silicon layer are much less expensive than silicon carbide substrates.

However, it has been observed that graphene layers formed in this way contain many cracks. FIGS. 1a and 1b are photographs of a portion of a graphene layer formed using the third process described above, FIG. 1b being an enlargement of a region I of FIG. 1a. FIGS. 4a and 4b are drawings schematically reproducing the photographs illustrated in FIG. 1a and FIG. 1b, respectively. With reference to FIGS. 1a, 1b, 4a, 4b, cracks may clearly be seen.

In order to obtain a high-quality graphene layer, the graphene layer is then definitively separated into the various pieces defined by the cracks. Thus, only small pieces of graphene, of about 5 to 10 microns in diameter, may be formed using this process.

It has been proposed to improve the third process by heating the substrate under a controlled flow of argon.

The inventor has observed that this does not prevent cracks from forming.

SUBJECT OF THE INVENTION

The aim of the invention is to provide a process for forming a graphene layer on the surface of a substrate comprising a silicon layer and a silicon carbide film placed on the silicon layer, this process allowing a higher quality graphene layer to be obtained than was possible with prior-art processes.

BRIEF DESCRIPTION OF THE INVENTION

For this purpose, a process is provided for forming a graphene layer on the surface of a substrate comprising a silicon layer, the process comprising, in succession, steps of:
  forming a silicon carbide film on a free surface of the silicon layer; and
  gradually heating the substrate until sublimation of the silicon in at least the first lattice-arrays of atoms of the silicon carbide film, in order to form the graphene layer on the silicon carbide film.

According to the invention, a silicon layer having a stepped free surface is used.

Surprisingly, a stepped silicon layer allows a silicon carbide film of much higher crystal and electronic quality to be formed.

FIGS. 2a and 2b are photographs of a portion of the silicon carbide film produced by the third prior-art process, in a first crystal direction (FIG. 2a) and a second crystal direction (FIG. 2b). FIGS. 5a and 5b are drawings schematically reproducing the photographs illustrated in FIG. 2a and FIG. 2b, respectively. FIGS. 2c and 2d are photographs of a portion of the silicon carbide film produced by the process according to the invention, in the first crystal direction (FIG. 2c) and the second crystal direction (FIG. 2d). FIGS. 5c and 5d are drawings schematically reproducing the photographs shown in FIG. 2c and FIG. 2d, respectively. Thus, with reference to FIGS. 2a to 2d and 5a to 5d, it may be seen that the silicon carbide film obtained by the process of the invention has a much more uniform crystal structure than the prior-art silicon carbide film.

The inventor has discovered that graphene formed from a silicon carbide film is particularly sensitive to the quality of the silicon carbide film, and in particular the quality of the free surface of the silicon carbide film. A stepped silicon layer thus allows a much higher quality silicon carbide film to be formed, thereby allowing much higher quality graphene to be obtained.

More precisely, the inventor has discovered that the cracks observed in graphene layers formed by prior-art processes are at least partially due to the substrate. Specifically, when the substrate is heated until sublimation of the silicon in the silicon carbide film, it turns out that silicon atoms in the substrate also tend to sublime at the surface of the silicon carbide film and diffuse into the substrate and the silicon carbide film through crystal defects (such as anti-site defects) in said substrate and said film. It will be recalled that in a crystal structure, a site is occupied by a given element. When said site is occupied by an atom of another element, an anti-site defect is said to exist.

Because of intrinsic mechanical strains in the silicon carbide film, and especially at the interface between the film and the substrate, this forced sublimation of substrate silicon atoms leads to cracks appearing in the graphene thus formed while cooling the substrate.

Thus, the smaller the number of defects in the silicon carbide film, the smaller the number of silicon atoms that will diffuse into the silicon carbide film from the substrate. Thus, it is possible to limit the appearance of cracks by controlling the crystal quality of the silicon carbide film.

According to the invention, a stepped silicon layer allows a silicon carbide film of much higher quality to be formed. For example, the silicon carbide film contains a much smaller number of anti-site defects, or even none at all. Thus, the appearance of the cracks in the graphene layer is prevented, thereby allowing much higher quality graphene to be obtained.

By way of example, the inventor has thus been able to obtain graphene layers a few centimeters square in size. The process makes high-speed carbon-based electronics technology more attractive, industrially speaking. Therefore, graphene may be used as an ideal platform for carbon-based electronic components.

Advantageously, the process allows large graphene-layer pieces to be formed independently of the crystal structure of the silicon layer or silicon carbide film, or of the direction of the crystal structure of the silicon layer, relative to which the free surface of the silicon layer is orientated.

BRIEF DESCRIPTION OF THE DRAWINGS

The invention will be better understood in light of the following description of a particular nonlimiting embodiment of the invention, given with reference to the appended figures in which, apart from FIGS. 1a, 1b, 4a, 4b, 2a, 2b, 2c, 2d, 5a, 5b, 5c and 5d, which were described above, FIG. 3 schematically illustrates the various steps of the process according to the invention.

DETAILED DESCRIPTION OF THE INVENTION

Figure 1A:
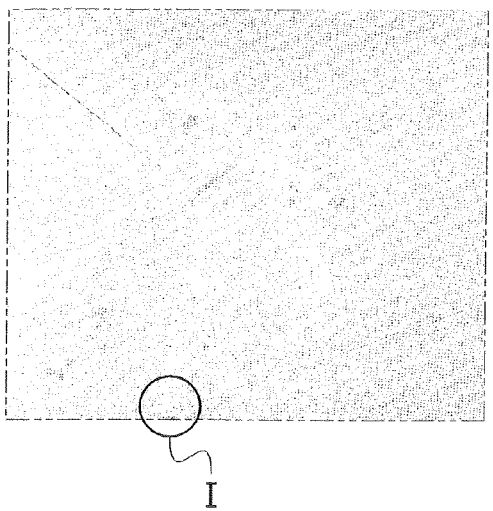
Figure 1B:
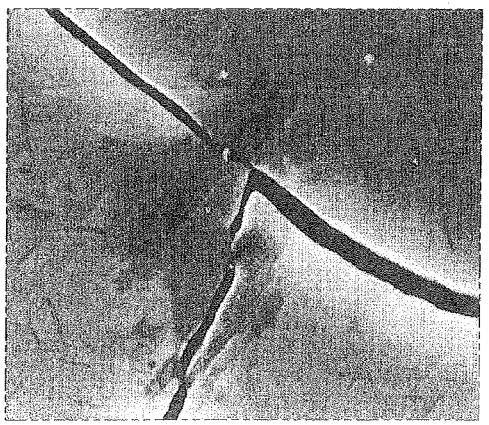
Figure 4A:
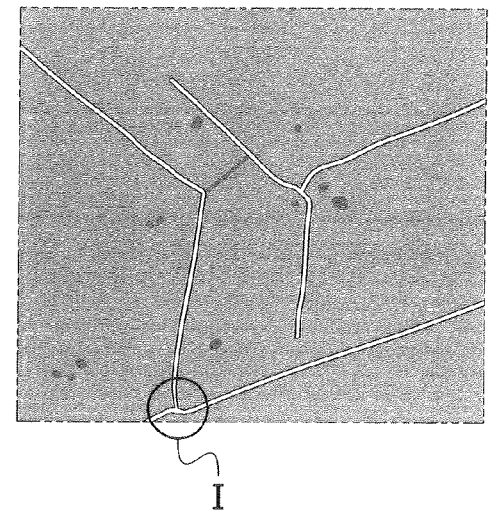
Figure 4B:
Figure 2A:
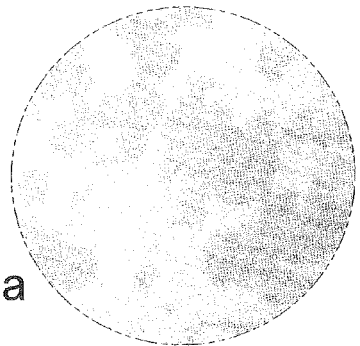
Figure 5A:
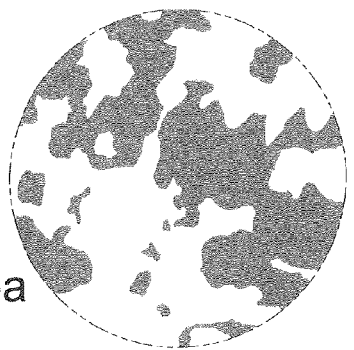
Figure 2B:
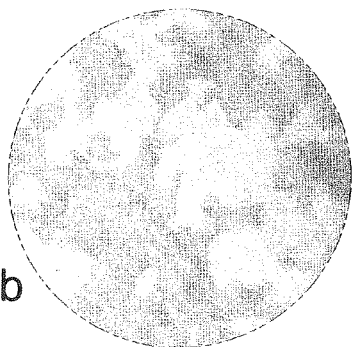
Figure 5B:
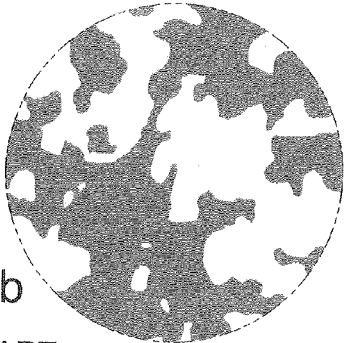
Figure 2C:
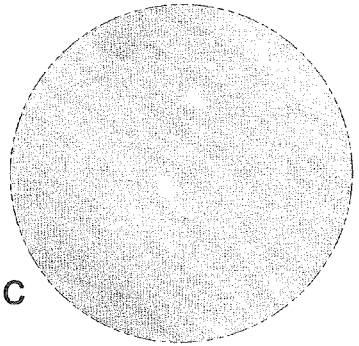
Figure 5C:
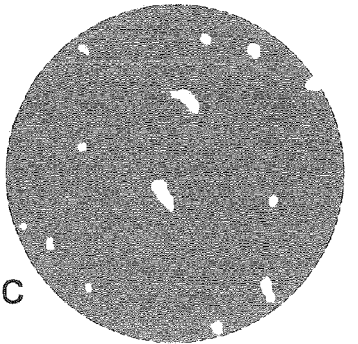
Figure 2D:
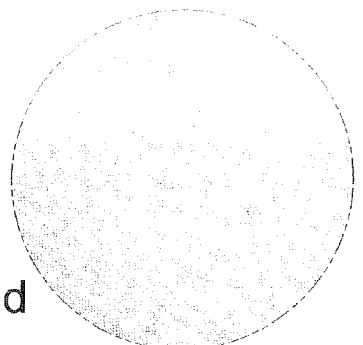
Figure 5D:
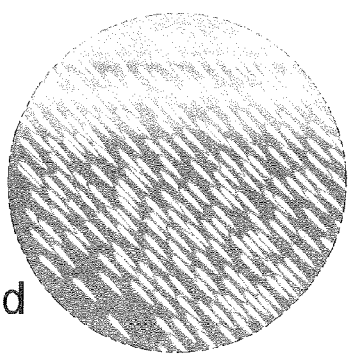
Figure 3:
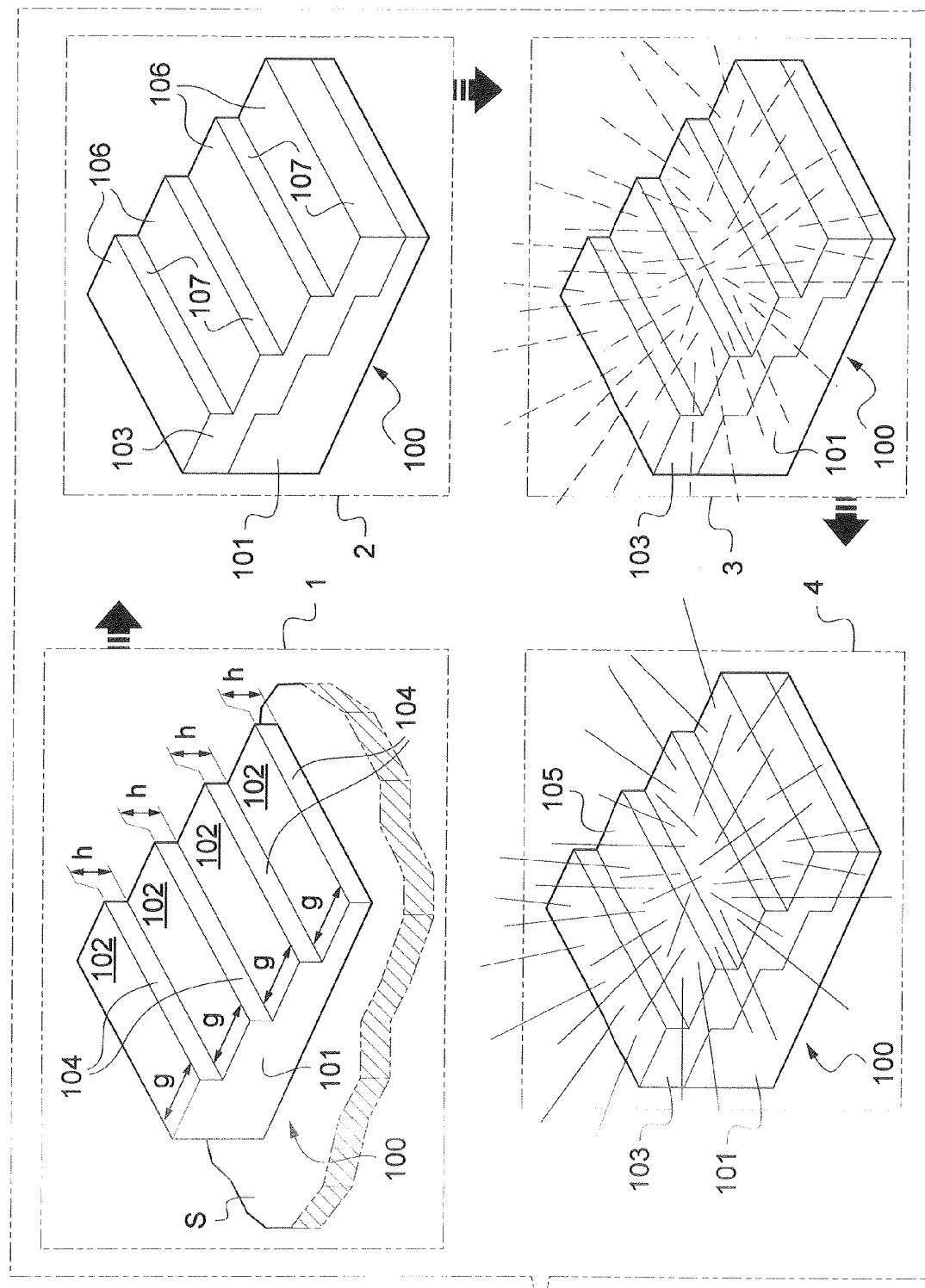

With reference to FIG. 3, a first step 1 of the process of the invention consists in using a substrate 100 comprising a silicon layer 101. According to the invention, a silicon layer 101 having a stepped free surface comprising treads 102 separated by risers 104 is used.

In a second step 2, a silicon carbide film 103 is formed on a free surface of the silicon layer 101 (the thickness of the silicon carbide film being exaggerated in FIG. 3 in order to make FIG. 3 easier to understand). The fact that the silicon layer 101 is stepped does not mean that the conventional processes used to form a silicon carbide film on the surface of a silicon layer have to be modified. For example, it is known to form such a silicon carbide film by chemical vapor deposition, by molecular beam epitaxy, or by vapor phase epitaxy, etc.

Because the free surface of the silicon layer 101 is stepped, the silicon carbide film 103 thus formed is also stepped and comprises treads 106 separated by risers 107.

Surprisingly, the quality of the silicon carbide film 103 is thus increased in comparison with the quality of a silicon carbide film formed on a substrate without steps.

In a third step 3, the substrate 100 is preheated under a controlled flow of gaseous silicon (represented by dashed lines). Thus, the free surface of the silicon carbide film 103 is saturated with silicon atoms, thereby delaying sublimation of the silicon of the silicon carbide when the substrate 100 is heated, as described below, in the fourth step 4.

By virtue of this third step 3, it is possible to control the moment when the silicon atoms of the silicon carbide film 103 start to sublime, thereby allowing said sublimation to be better controlled and a higher quality final graphene layer to be obtained.

In the fourth step 4, the substrate 100 is heated by gradually increasing the heating temperature until sublimation of the silicon in at least the first lattice-arrays of atoms of the silicon carbide film 103.

Provided the substrate 100 is heated gradually, regions containing a higher concentration of carbon atoms are then formed on the surface of the silicon carbide film 103, which carbon atoms naturally arrange themselves into a crystal structure that is that of graphene. Thus, a graphene layer 105 is formed on the silicon carbide film 103 by thermal annealing of at least part of the silicon carbide film 103.

According to one preferred embodiment, the risers 104 of the silicon layer 101 have substantially identical rises $\underline{h}$, whereas the treads 102 in the silicon layer 101 have substantially identical runs $\underline{g}$.

Advantageously, the free surface of the silicon layer is then even better able to promote the formation of a higher quality silicon carbide film 103, and therefore of a higher quality graphene layer 105.

According to one preferred embodiment, each riser 104 of the silicon layer 101 extends substantially perpendicularly to the two adjacent treads 102 in the silicon layer 101.

Preferably, each tread 102 of the silicon layer 101 extends substantially flat, i.e. substantially parallel to a holder S on which the substrate 100 rests.

Advantageously, the free surface of the silicon layer 101 is then even better able to promote the formation of a higher quality graphene layer.

Preferably, in this fourth step 4, the substrate 100 is heated under a controlled flow of inert gas. Preferably, the inert gas is nitrogen (represented by solid lines).

It turns out that heating under a controlled flow of nitrogen allows the sublimation of the silicon atoms to be better controlled and a better quality final graphene layer to be obtained.

One particular example embodiment of the process of the invention will now be described. Of course, this example is nonlimiting.

In the first step 1, a silicon layer 101 that has a cubic crystal structure, and the stepped free surface of which comprises substantially identical treads 102 and risers 104, is used, each riser 104 extending substantially perpendicularly to the two adjacent treads 102. Furthermore, each tread 102 extends substantially flat. The risers 104 have a rise h comprised between 2 and 3 ångströms, and the treads 102 have a run comprised between 35 and 40 ångströms.

In the second step 2, the silicon carbide film 103 is formed on the silicon layer 101. Preferably, the silicon carbide film 103 is formed in a way such that it has a 3C crystal structure.

In an intermediate step, the substrate 100 is heated to 600 degrees Celsius under ultrahigh vacuum conditions for several hours. As is known, this step allows the layer to be degassed, thereby removing therefrom water molecules or molecules adsorbed on the silicon carbide film, so as to improve the quality of said film.

In the third step 3, the substrate 101 is preheated by raising the heating temperature to 700 degrees Celsius, under a controlled flow of gaseous silicon set to 10 to 15 monolayers per minute.

Next, in the fourth step 4, the substrate 100 is gradually heated by increasing the heating temperature from 700 degrees Celsius to 1300 degrees Celsius under a controlled flow of nitrogen at a pressure of $1\times10^{-5}$ millimeters of mercury in order to obtain the graphene layer 105.

The invention is not limited to what was just described but in contrast encompasses any variant falling within the scope defined by the claims.

In particular, the process according to the invention will possibly not comprise the third step 3 in which the substrate 100 is preheated under a controlled flow of gaseous silicon. In the third step 3, the substrate will instead possibly be preheated under a controlled flow of inert gas, for example nitrogen, and not under a controlled flow of gaseous silicon. As a variant, in the third step 3, the substrate will possibly be preheated under both a controlled flow of gaseous silicon and a controlled flow of inert gas.

In the fourth step 4, a controlled flow of inert gas will possibly not be streamed over the substrate 100 while it is heated. The substrate 100 will possibly be heated under a controlled flow of an inert gas other than nitrogen, such as argon for example.

As was mentioned above in the example described, the process according to the invention will possibly comprise various intermediate steps between the second step 2 of forming the silicon carbide film, and the fourth step 4 of forming the graphene layer 105, in order to treat the silicon carbide film 103 in various ways. Once more, the graphene formed from a silicon carbide film is particularly sensitive to the quality of the surface of the silicon carbide film. The better the crystal quality of the silicon carbide film 103, the better the quality of the graphene layer 105 obtained will be as the latter will especially contain a small number of cracks, or even none at all and fewer crystal defects. For example, the silicon carbide film 103 will possibly be subjected to a chemical treatment, such as wet etching (wet etching of the free surface), or even annealed under hydrogen.

The example described is nonlimiting. Thus, the dimensions of the stepped free surface of the silicon layer 101 or its crystal structure will possibly be used to control the properties of the graphene layer 105 that it is sought to form. The heating temperature of the substrate 100 and the pressure under which the heating is carried out will possibly also be used to control the formation of the graphene layer 105.

For example, the substrate will possibly be heated to another temperature in the third step 3 and in the fourth step 4. Preferably, in this fourth step 4, the substrate 100 will be heated to a temperature comprised between 1200 degrees Celsius and 1400 degrees Celsius. It will also be possible, in this fourth step, to heat the substrate 100 under a pressure other than $1\times10^{-5}$ millimeters of mercury. Specifically, the pressure chosen will possibly be a pressure between about atmospheric pressure and a pressure of about $1\times10^{-7}$ millimeters of mercury.

The invention claimed is:

1. A process for forming a graphene layer on a surface of a substrate comprising a silicon layer, the process comprising, in succession, steps of:
    forming a silicon carbide film on a free surface of the silicon layer; and
    gradually heating the substrate until sublimation of silicon in at least the first lattice-arrays of atoms of the silicon carbide film, in order to form the graphene layer on the silicon carbide film,
    wherein the free surface of the silicon layer is a stepped free surface; and
    wherein the process comprises the prior step of preheating the substrate under a controlled flow of gaseous silicon, before the step of gradually heating the substrate until sublimation of silicon in at least the first lattice-arrays of atoms in the silicon carbide film.

2. The process as claimed in claim 1, in which the stepped free surface comprises treads separated by risers that have substantially identical rises, whereas the treads have substantially identical runs.

3. The process as claimed in claim 1, in which the stepped free surface comprises treads separated by risers that extend substantially perpendicularly to two adjacent treads.

4. The process as claimed in claim 1, in which the stepped free surface comprises treads separated by risers, each tread extending substantially parallel to a holder on which the substrate rests.

5. The process as claimed in claim 1, in which the stepped free surface comprises treads separated by risers that have a rise between 2 and 3 ångströms, whereas the treads have a run between 35 and 40 ångströms.

6. The process as claimed in claim 1, in which the substrate is gradually heated in a controlled inert gas atmosphere.

7. The process as claimed in claim 6, in which the inert gas is nitrogen.

* * * * *